United States Patent
Defazio et al.

(10) Patent No.: US 8,209,562 B2
(45) Date of Patent: Jun. 26, 2012

(54) DOUBLE DATA RATE CONVERTER CIRCUIT INCLUDES A DELAY LOCKED LOOP FOR PROVIDING THE PLURALITY OF CLOCK PHASE SIGNALS

(75) Inventors: Jody Defazio, Ottawa (CA); Oswald Becca, Roundrock, TX (US); Peter Nyasulu, Ottawa (CA)

(73) Assignee: Mosaid Technologies Incorporated, Ottawa (CA)

( * ) Notice: Subject to any disclaimer, the term of this patent is extended or adjusted under 35 U.S.C. 154(b) by 127 days.

(21) Appl. No.: 12/684,026

(22) Filed: Jan. 7, 2010

(65) Prior Publication Data

US 2010/0122104 A1 May 13, 2010

Related U.S. Application Data

(63) Continuation of application No. 11/536,709, filed on Sep. 29, 2006, now Pat. No. 7,661,010.

(60) Provisional application No. 60/803,557, filed on May 31, 2006.

(51) Int. Cl.
*G06F 1/12* (2006.01)
*G06F 1/04* (2006.01)

(52) U.S. Cl. ........ 713/500; 713/400; 713/401; 713/501; 713/502; 713/503; 713/600; 713/601

(58) Field of Classification Search .................. 713/400, 713/401, 500–503, 600, 601
See application file for complete search history.

(56) References Cited

U.S. PATENT DOCUMENTS

| | | | |
|---|---|---|---|
| 6,373,414 B2 | 4/2002 | Koga et al. | |
| 6,392,946 B1 | 5/2002 | Wu et al. | |
| 6,516,363 B1 | 2/2003 | Porter et al. | |
| 6,762,560 B1 | 7/2004 | Guosheng et al. | |
| 6,813,696 B2 | 11/2004 | Kanda et al. | |
| 7,009,423 B1 | 3/2006 | Andrews et al. | |
| 7,010,713 B2 | 3/2006 | Roth et al. | |
| 7,135,899 B1 * | 11/2006 | Sancheti et al. | 327/144 |
| 7,190,754 B1 | 3/2007 | Chang et al. | |
| 7,376,043 B2 | 5/2008 | Murayama | |
| 7,409,005 B2 | 8/2008 | Chang et al. | |
| 7,486,702 B1 * | 2/2009 | Yang | 370/518 |

(Continued)

OTHER PUBLICATIONS

Interfacing QDR II SRAM with Virtex-II Pro Devices, Cypress Semiconductor Corporation Revised May 16, 2005.*

*Primary Examiner* — Vincent Tran
(74) *Attorney, Agent, or Firm* — Dennis R. Haszko

(57) ABSTRACT

In a memory interface, a delay locked loop (DLL) is added to the system in order to provide an accurate, PVT insensitive translation of the drive clocks into the write data eye. Adding a master-slave DLL to the system provides an accurate, PVT insensitive translation of the echo clocks into the read data eye. Solidifying the timing critical drive and receive logic which directly interfaces to the I/O buffers reduces the pin-to-pin skews. Utilizing clock phase outputs of the DLL in the solidified drive and receive logic blocks reduces further the skew between the clock and related data signals, and also removes the reliance on a differential clock. The system allows a much more relaxed constraint on clock duty cycle. Design of circuitry within the solidified drive and receive logic blocks permits simple logic modeling for fit within an ASIC flow. Physical design of the solidified drive and receive logic blocks permits simple fit within ASIC place and route flows for increased ease of implementation and ease of reuse.

10 Claims, 13 Drawing Sheets

U.S. PATENT DOCUMENTS

| | | |
|---|---|---|
| 7,522,440 B2 | 4/2009 | Park et al. |
| 7,596,710 B2 | 9/2009 | Roth et al. |
| 7,885,140 B2 * | 2/2011 | Gillingham et al. ....... 365/233.1 |
| 2001/0039602 A1 * | 11/2001 | Kanda et al. ................... 711/105 |
| 2003/0194018 A1 * | 10/2003 | Chang ........................... 375/295 |
| 2004/0150539 A1 * | 8/2004 | Okajima ....................... 341/100 |
| 2004/0236894 A1 * | 11/2004 | Grundy et al. ..................... 711/1 |
| 2004/0239365 A1 * | 12/2004 | Young et al. ..................... 326/41 |
| 2005/0286672 A1 | 12/2005 | Lin et al. |
| 2006/0031620 A1 * | 2/2006 | Jakobs et al. ................. 710/305 |
| 2006/0103439 A1 * | 5/2006 | Roth et al. ..................... 327/156 |
| 2008/0043545 A1 | 2/2008 | Vink et al. |

* cited by examiner

DOUBLE DATA RATE CONVERTER CIRCUIT INCLUDES A DELAY LOCKED LOOP FOR PROVIDING THE PLURALITY OF CLOCK PHASE SIGNALS

REFERENCE TO RELATED APPLICATIONS

This application is a continuation of U.S. patent application Ser. No. 11/536,709 filed Sep. 29, 2006, now U.S. Pat. No. 7,661,010, issued Feb. 9, 2010, which claims the benefit of U.S. Application No. 60/803,557, filed May 31, 2006, the contents of which are incorporated herein by reference in their entirety.

FIELD OF THE INVENTION

The present invention relates generally to memory interface architecture. More particularly, the present invention relates to an apparatus and a method for interfacing to a memory.

BACKGROUND OF THE INVENTION

Presently, high performance systems rely on advanced technology, higher processor clock rates and higher data rates to and from these processors. One area of issue is the external memory interface, which is an intermediary device between the system, such as a processor, and a memory, such as static random access memory (SRAM). There are different types of SRAM available, each type adhering to a particular set of operating protocols. For example, there is double data rate (DDR) SRAM and quad data rate (QDR) SRAM, both requiring different signaling protocols. For high performance SRAM memories being clocked at high frequencies, it is important that the memory interface can provide the appropriate timing to ensure robust and high speed operation of the memory.

One such high performance SRAM is the second generation quad data rate (QDR2) SRAM. Accordingly, a corresponding QDR2 SRAM interface can be used to adapt processor control signals for the QDR2 protocols. However, interfacing to external memory at high clock rates poses a large challenge due to the reduced clock cycle and various system timing skews, such as voltage and temperature variation, crosstalk, Vref variations, simultaneous-switching output (SSO) noise and simultaneous-switching input (SSI) noise, and clock source jitter. Together, this causes a narrow data window to pass between the host device, such as the processor integrated circuit (IC), and the memory, such as SRAM.

QDR2 SRAM interfacing further reduces the window by approximately 50% since the data is clocked on both edges of the system clock, providing twice as much data compared to regular SRAM devices. QDR2 SRAMs are currently being used at a clock rate of 333 MHz, which is a data rate of 666 Mbps. At these rates, the maximum ideal data eye is 1.5 ns, leaving a maximum ideal allowance of 750 ps for setup time (tSU) requirements and 750 ps for hold time (tHD) requirements. After applying the various system timing offsets to these allowances, standard design techniques are proven to not provide a feasible solution to interfacing with these memories at these data rates. Custom techniques may provide a solution, however these solutions are complex to implement, do not fit into ASIC design flows, are not readily re-usable, and require large efforts to port between foundries or process nodes.

Previous approaches have been taken to design and implement high-speed QDR2 SRAM memory interface circuits for higher data rates to and from the processors. One such approach is to fully-synthesize the memory interface. Using this approach, synthesizeable design code, typically in an HDL (high-level design language) format (i.e. Verilog), is provided as the solution. The memory interface circuit is developed by using a standard cell library to synthesize this design code, and map it to a technology-specific set of logic gates. This code is then mated to the corresponding I/O buffer cells. The advantage of the fully-synthesizeable approach is ease of implementation at lower data rates and foundry/process node portability. This is mainly due to the fact that standard cell libraries are conservatively configured for robust operation, but only at lower operating frequencies. The disadvantage of this approach is the inability to meet high data rates. As an example, solutions such as these typically achieve approximately 166 MHz, but fail to operate properly between 200 MHz-250 MHz, even after a high degree of manual intervention, which is not easy to implement. Therefore, desired high performance clock rates, such as 333 MHz cannot be easily achieved.

There are three primary issues that must be considered for a synthesized QDR2 SRAM memory interface design. First is minimizing data skew, the second is clock generation, and third is testing. Following is a more detailed discussion of each of these issues.

High data rates require low pin-to-pin skews, which require matched data paths. This is difficult to achieve with a synthesizeable solution due to the pseudo-random nature of synthesis and optimization tools, and of placement and routing tools. In otherwords, circuit element layout and signal line routing cannot be precisely controlled.

Clock generation can be a particularly difficult issue. The protocol of QDR2 SRAM interfacing requires source clocks to be centered in sent data eyes and translation of echo clocks into received data eyes. The PVT (Process/Voltage/Temperature) sensitive nature of standard cell elements causes these clock/data relationships to be unreliable at high data rates. Some systems require an external phase-locked loop (PLL) to generate a clock with a frequency twice that of the memory interface. This requires a wide distribution of 2× frequency clocks, which complicates chip implementation and verification. Some synthesized solutions rely on the falling edge of the system clock, which introduces duty cycle problems into the design, further reducing the achievable data rate.

Circuit testability is an important feature to validate the operation of high performance systems. Secondary tools within the ASIC flows for tasks such as DFT (design for test) and boundary scan insertion, tend to add to the problems of pseudo-random gates, placements, and routing. Hence, the pseudo-random nature of the resultant interface adds tremendous overhead to product test and debug tasks since every pin of the interface has the potential for a differing response to PVT variations, electrical noise, and source clock uncertainties.

Another possible approach includes solidifying, or manually designing, a portion of the circuitry close to the I/O buffer, which directly impacts the system timing performance. This technique can be considered a partially synthesized approach. The advantage of this technique is the removal of the pseudo-random nature of ASIC tool outputs (synthesis/placement/optimization/DFT/routing) from the interface to provide a much more controlled pin-to-pin skew. However, several issues still remain, as is described below.

There is a continued reliance on standard design methods for clock translation into the data eyes, as there is a reliance on a differential system clock with a requirement for a highly controlled phase difference. If widely distributed, there is a continued requirement for high control over the phase difference of the differential clock. Accordingly, implementation complexity remains high.

SUMMARY OF THE INVENTION

According to one aspect, there is provided an apparatus for interfacing to a memory. The apparatus includes a clock phase providing circuit for receiving an input clock signal and for providing a plurality of corresponding clock phases and a single to double data rate converting circuit for receiving data and at least two of the plurality of corresponding clock phases and for providing rate converted data at a rate corresponding to a combination of the at least two of the plurality of corresponding clock phases.

Advantageously, the apparatus further includes a clock delay circuit for receiving at least two clock signals related to incoming data and for delaying the clock signals, and a data rate conversion circuit for receiving the incoming data and the delayed clock signals and for providing rate converted data at a rate corresponding to a combination of the delayed clocks.

In accordance with another aspect, there is provided a memory interface circuit. The memory interface circuit includes a clock phase circuit, a first single to double data rate converting circuit, and a second single to double data rate converting circuit. The clock phase circuit receives a reference clock signal and provides first, second, third and fourth corresponding clock phases, where each is shifted in phase relative to the other. The first single to double data rate converting circuit receives a first type of data at a single data rate, the first corresponding clock phase and the third corresponding clock phase. The first single to double data rate converting circuit provides the first type of data at a double data rate corresponding to a combination of the first and the third corresponding clock phases. The second single to double data rate converting circuit receives a second type of data at the single data rate, the second corresponding clock phase and the fourth corresponding clock phase. The second single to double data rate converting circuit provides the second type of data at the double data rate corresponding to a combination of the second and the fourth corresponding clock phases.

According to embodiments, the first, second, third and fourth corresponding clock phases are shifted in phase by multiples of 90 degrees relative to each other. Preferably, the second corresponding clock phase is shifted 90 degrees from the first corresponding clock phase, the third corresponding clock phase is shifted 180 degrees from the first corresponding clock phase, and the fourth corresponding clock phase is shifted 270 degrees from the first corresponding clock phase. The first type of data can include one of write data, command data and address data, while the second type of data can include preset logic state data.

According to another embodiment, the first type of data can include a first data stream and a second data stream received synchronous to the first corresponding clock phase. The first single to double data rate converting circuit can provide data of the first data stream and the second data stream synchronous to active edges of the first and the third corresponding clock phases. The first single to double data rate converting circuit can include edge detection circuitry, a selection circuit and a register circuit. The edge detection circuitry detects the active edges of the first and the third corresponding clock phases, and provides a selection signal in response to each detected active edge. The selection circuit passes one bit of the first data stream in response to one state of the selection signal, and passes one bit of the second data stream in response to another state of the selection signal. The register circuit receives and provides the one bit of the first data stream and the one bit of the second data stream synchronously with the detected active edges of the first and the third corresponding clock phases.

According to yet another embodiment, the second type of data includes a preset high logic state signal and a preset low logic state signal. The second single to double data rate converting circuit provides the high logic state signal and the low logic state signal synchronous to active edges of the second and the fourth corresponding clock phases. The second single to double data rate converting circuit can include edge detection circuitry, a selection circuit and a register circuit. The edge detection circuitry detects the active edges of the second and the fourth corresponding clock phases, and provides a selection signal in response to each detected active edge. The selection circuit passes the preset high logic state signal in response to one state of the selection signal, and passes the preset low logic state signal in response to another state of the selection signal. The register circuit receives and provides the preset high logic state signal and the preset low logic state signal synchronously with the detected active edges of the second and the fourth corresponding clock phases.

In an embodiment, the memory interface circuit further includes a clock delay circuit and a data rate conversion circuit. The clock delay circuit receives an output clock signal and a complementary output clock signal, and provides a delayed output clock signal and a delayed complementary output clock signal. The data rate conversion circuit receives incoming data at the double data rate, the delayed output clock signal and the delayed complementary output clock signal. The data rate conversion circuit converts the incoming data to single data rate data in response to the delayed output clock signal and the delayed complementary output clock signal. According to aspects of the present embodiment, the clock delay circuit can include a delay locked loop for delaying the delayed output clock signal by a phase shift of 90 degrees relative to the output clock signal, and delays the delayed complementary output clock signal by a phase shift of 90 degrees relative to the complementary output clock signal. The data rate conversion circuit can include a double to single data rate converting circuit and a clock domain conversion circuit. The double to single data rate converting circuit converts the incoming data into a first data stream and a second data stream, the first data stream and the second data stream being synchronized to the delayed output clock signal and the delayed complementary output clock signal. The clock domain conversion circuit receives the first data stream and the second data stream, and synchronizes the first data stream and the second data stream to a control clock corresponding to the single data rate. The single data rate data corresponds to the first data stream and the second data stream synchronized to the control clock.

According to another aspect, the double to single data rate converting circuit can include a first input register, a second input register, a third input register. The first input register latches a first bit of the incoming data in response to an active edge of the delayed output clock signal, and provides a first buffered bit corresponding to the first data stream. The second input register latches a second bit of the incoming data in response to an active edge of the delayed complementary output clock signal, and provides a second latched bit. The third input register latches the second latched bit in response to the active edge of the delayed output clock signal, and provides a second buffered bit, the second buffered bit corresponding to the second data stream. In another aspect of the present embodiment, the clock domain conversion circuit can include a first-in first-out (FIFO) circuit. The FIFO circuit can include input registers, a write pointer, a multiplexer, and a read pointer circuit. The input registers receive the first data stream and the second data stream. The write pointer selectively enables one input register in response to the delayed output clock signal. The multiplexer selectively passes outputs of the input registers in response to a selection signal. The read pointer circuit provides the selection signal synchronized to the control clock, in response to a signal derived from the write pointer circuit.

In accordance with a further aspect, there is provided a memory interface circuit having a control circuit, a first data rate converting circuit, a second data rate converting circuit, and a third data rate conversion circuit. The control circuit provides write data and receives read data. The first data rate converting circuit receives and converts the write data to memory write data for the memory in response to a combination of a first set of clock phases. The second data rate converting circuit provides an output clock for the memory in response to a combination of a second set of clock phases, the second set of clock phases being phase shifted relative to the first set of clock phases. The third data rate conversion circuit converts memory read data to the read data in response to delayed echo clocks.

According to an embodiment, the first set of clock phases can include a first clock phase and a second clock phase shifted by 180 degrees relative to the first clock phase, and the second set of clock phases can include a third clock phase shifted 90 degrees relative to the first clock phase and a fourth clock phase shifted 180 degrees relative to the third clock phase. The memory interface circuit can further include a clock phase circuit for receiving a reference clock and generating the first clock phase, the second clock phase, the third clock phase and the fourth clock phase. The memory interface circuit can further include a clock delay circuit for receiving echo clocks from the memory and delaying the echo clocks by 90 degrees to generate the delayed echo clocks.

In accordance with a yet further aspect, there is provided a method for interfacing data between a memory and a system. The method includes providing a plurality of clock phases from a reference clock; converting system data to memory data in response to a combination of a first set of the plurality of clock phases; and providing a memory clock in response to a combination of a second set of the plurality of clock phases. According to embodiments of the present aspect, the memory data can include memory address data, memory command data and memory write data. The memory command data can include a memory write command for instructing the memory to store the memory write data at an address corresponding to the memory address data.

In an aspect, the memory command data can include a memory read command for instructing the memory to output memory read data from an address corresponding to the memory address data. Accordingly, the method can further include receiving echo clocks from the memory, delaying the echo clocks to provide delayed echo clocks, and converting the memory read data into system read data in response to the delayed echo clocks. Preferably, the echo clocks are delayed by a 90 degree phase shift.

In an embodiment, there is provided a memory interface circuit comprising a clock phase circuit, such as a delay locked loop, and a plurality of output circuits having substantially identical layouts. The clock phase circuit receives a reference clock signal and provides a plurality of clock phase signals shifted in phase relative to each other. Each output circuit receives one of a plurality of single data rate signals, such as address, command and/or data information, and the plurality of clock phase signals, and provides an output signal having bits from the respective one of the plurality of single data rate signals synchronized to the plurality of clock phase signals, and each of the plurality of output circuits having a substantially identical layout.

In a further embodiment, there is provided a memory interface circuit comprising a clock phase circuit, such as a delay locked loop, and a plurality of output circuits having substantially identical layouts. The clock phase circuit receives a reference clock signal and provides a plurality of clock phase signals shifted in phase relative to each other. Each output circuit receives a high logic state signal, a low logic state signal, and the plurality of clock phase signals. At least two of the plurality of output circuits provide a pair of complementary clock signals.

In yet another embodiment, there is provided an output circuit for converting a plurality of single data rate signals to an increased data rate signal. The output circuit comprises a plurality of registers, an edge detector, a multiplexor and an output register. The plurality of registers each receive one of a respective plurality of input signals, and provide a respective plurality of intermediate signals synchronized to a first input clock signal. The edge detector detects an edge of each of a plurality of input clock signals including the first input clock signal, and provides a multiplexor control signal and an increased data rate clock. The multiplexor receives the multiplexor control signal, and provides a multiplexor output signal by sequentially selecting one of the plurality of intermediate signals or a first input signal not included in the plurality of input signals. The output register then synchronizes the multiplexor output to the increased data rate clock, and provides the increased data rate signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A delay locked loop (DLL) is added to the system in order to provide an accurate, PVT insensitive translation of the drive clocks into the write data eye. Adding a master-slave DLL to the system provides an accurate, PVT insensitive translation of the echo clocks into the read data eye. Solidifying the timing critical drive and receive logic which directly interfaces to the I/O buffers reduces the pin-to-pin skews. Utilizing clock phase outputs of the DLL in the solidified drive and receive logic blocks reduces further the skew between the clock and related data signals, and also removes the reliance on a differential clock. The system allows a much more relaxed constraint on clock duty cycle. Design of circuitry within the solidified drive and receive logic blocks permits simple logic modeling for fit within an ASIC flow. Physical design of the solidified drive and receive logic blocks permits simple fit within ASIC place and route flows for increased ease of implementation and ease of reuse.

Figure 1A:
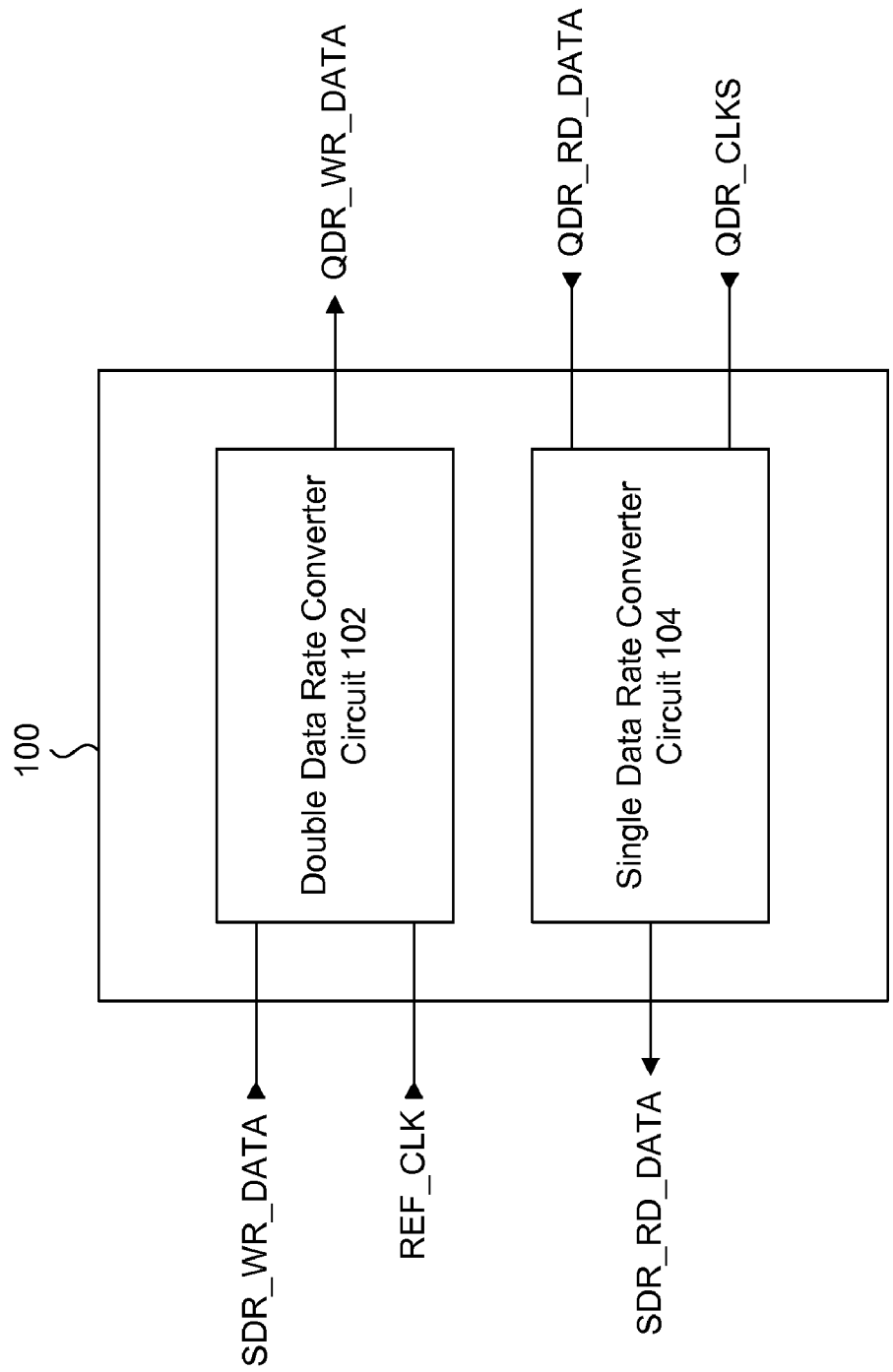
FIG. 1A is a conceptual block diagram of a memory interface.

FIG. 1A is a conceptual block diagram of a memory interface according to an embodiment of the present invention. QDR SRAM memory interface 100 is used as an interface between a system/processor and a QDR SRAM memory, and includes two major circuit blocks. First is the double data rate converter circuit 102, and second is the single data rate converter circuit 104.

The double data rate converter circuit 102 receives data from the system/processor to be written to the memory, labeled SDR_WR_DATA, and a reference clock REF_CLK. The write data is provided at the single data rate, in other-words, one bit of data on the rising edge of REF_CLK. The double data rate converter circuit 102 generates the double data rate clock and converts the single data rate write data into the double data rate format, as QDR_WR_DATA. In other-words, single-bit wide QDR_WR_DATA is provided to the SRAM on the rising and falling edges of each REF_CLK cycle. Naturally, those skilled in the art will understand that SDR_WR_DATA should be at least 2-bits wide, meaning that at least two bits of data are received in parallel.

The single data rate converter circuit 104 executes the opposite function for a read operation from the SRAM. Single-bit wide data being read out from the SRAM, called QDR_RD_DATA, is provided on both the rising and falling edges of the SRAM clock, QDR_CLKS. The single data rate converter circuit 104 then converts the double data rate (DDR) read data into the single data rate (SDR) format, called SDR_RD_DATA. The SDR format of SDR_RD_DATA should be at least 2-bits wide.

The DDR converter circuit 102 does not use a 2× clock, but instead generates several phases from an input reference clock which are then combined to develop the DDR output data stream. Hence the output data stream is independent of the duty cycle of the input reference clock. The single data rate converter circuit 104 uses complementary phases of the QDR SRAM clock to develop the SDR output stream. It is noted that other control signals are not shown in order to simplify the schematic, but those skilled in the art will understand that such control signals are required for proper operation of the circuits.

Figure 1B:
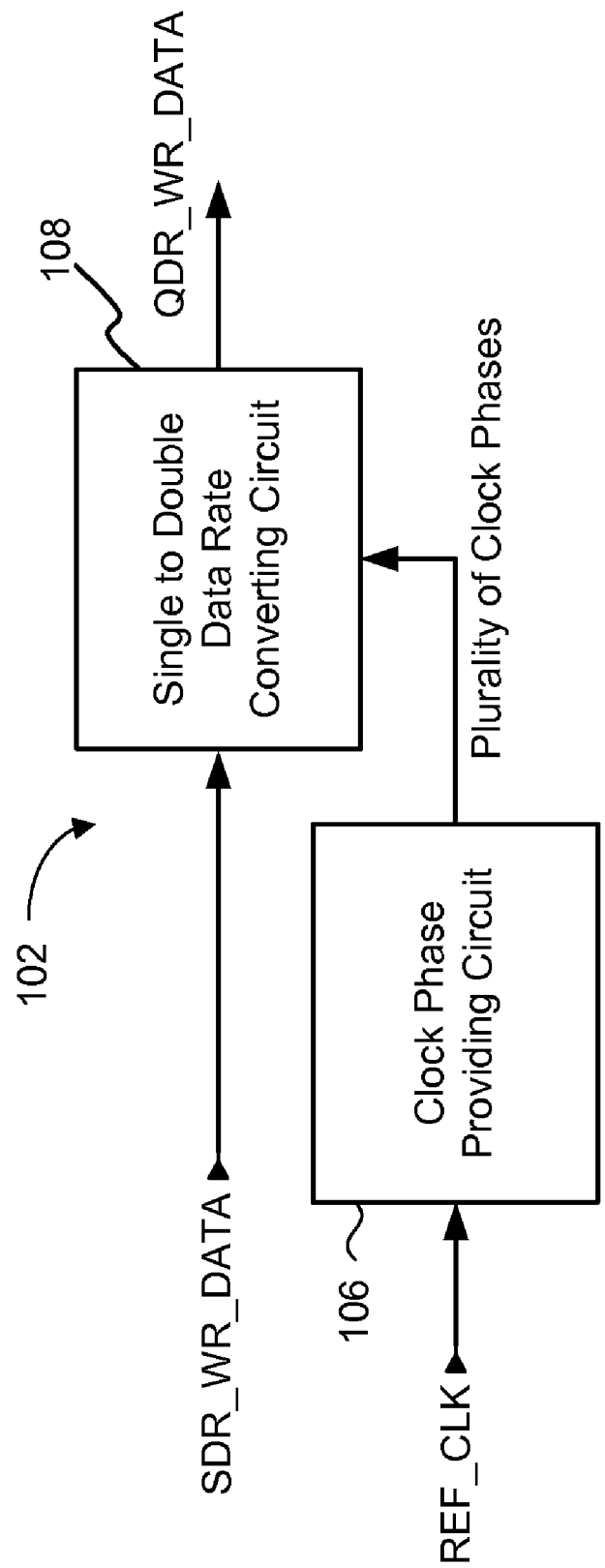
FIG. 1B is a conceptual block diagram of a double data rate converter circuit according to an embodiment of the present invention.

FIG. 1B is a diagram showing functional blocks of the double data rate converter circuit 102 shown in FIG. 1A, according to an embodiment of the present invention. Referring to FIG. 1B, the double data rate converter circuit 102 includes a clock phase providing circuit 106 and a single to double data rate converting circuit 108. In response to an input clock signal REF_CLK, the clock phase providing circuit 106 provides a plurality of corresponding clock phases. In response to data SDR_WR_DATA and at least two of the plurality of corresponding clock phases, the single to double data rate converting circuit 108 provides rate converted data at a rate corresponding to a combination of the at least two of the plurality of corresponding clock phases. This data is output as QDR_WR_DATA at the double data rate for the SRAM.

Figure 1C:
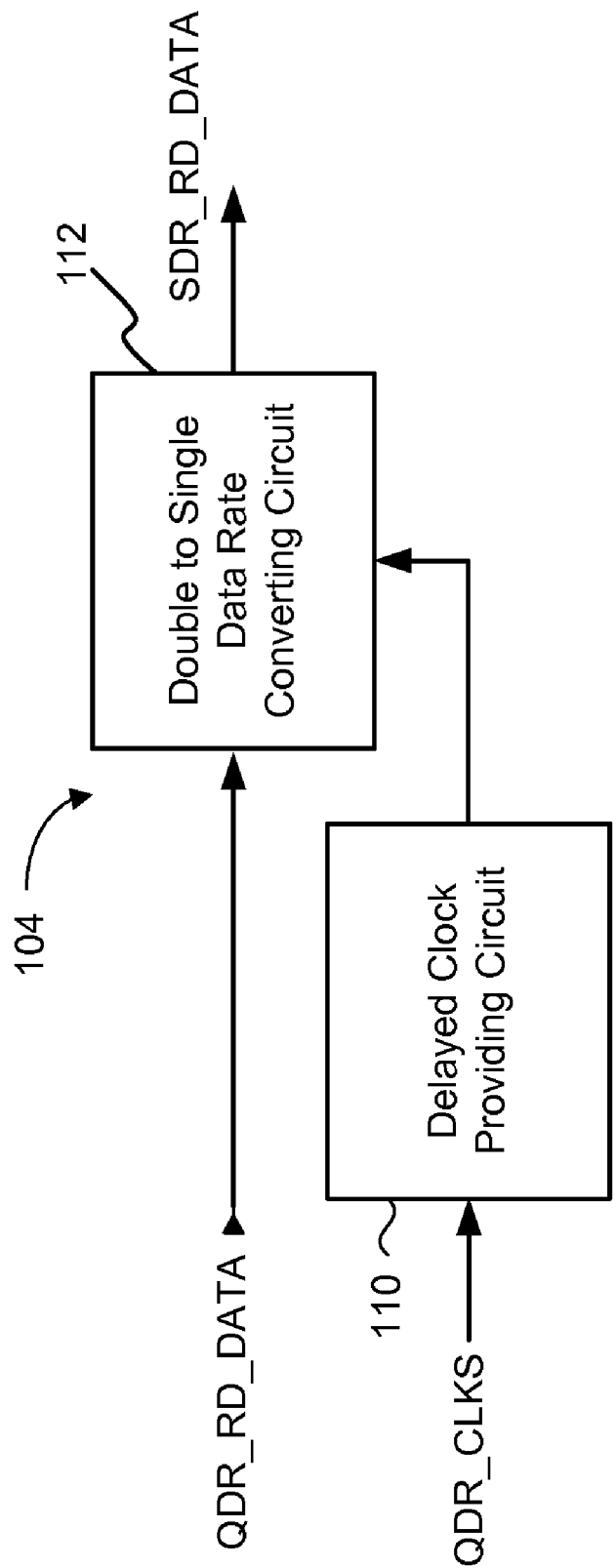
FIG. 1C is a conceptual block diagram of a single data rate converter circuit according to an embodiment of the present invention.

FIG. 1C is a diagram showing functional blocks of the single data rate converter circuit 104 shown in FIG. 1A, according to an embodiment of the present invention. Referring to FIG. 1C, the single data rate converter circuit 104 includes a delayed clock providing circuit 110 and a double to single data rate converting circuit 112. In response to clocks QDR_CLKS received from the SRAM, the delayed clock providing circuit 110 provides delayed clocks to the double to single data rate converting circuit 112. The double to single data rate converting circuit 112 receives DDR data QDR_RD_DATA from the SRAM, and provides rate converted data SDR_RD_DATA at a rate corresponding to the delayed clocks.

According to an embodiment of the present invention, there is provided a means to interface to one or more QDR2 SRAM devices. It may be implemented into ICs which interface with QDR2 SRAMs. A common example is networking products such as network processors or switch fabrics which tend to have similar data read and write demands for the external memory, and thus take advantage of the simultaneous read/write nature of QDR2 SRAMs.

In embodiments of the present invention, the double data rate converter circuit 102 includes a delay locked loop (DLL) circuit in order to provide an accurate, PVT insensitive translation of the drive clocks into the write data eye. The single data rate converter circuit 104 includes a master-slave DLL in order to provide an accurate, PVT insensitive translation of the echo clocks into the read data eye. Solidifying the timing critical drive and receive logic which directly interfaces to the I/O buffers reduces the pin-to-pin skews. Utilizing clock phase outputs of the DLL in the solidified drive and receive logic blocks reduces further the skew between the clock and related data signals, and also removes the reliance on a differential clock. The system allows a much more relaxed constraint on clock duty cycle. Design of circuitry within the solidified drive and receive logic blocks permits simple logic modeling for fit within an ASIC flow. Physical design of the solidified drive and receive logic blocks permits simple fit within ASIC place and route flows for increased ease of implementation and ease of reuse.

Figure 2:
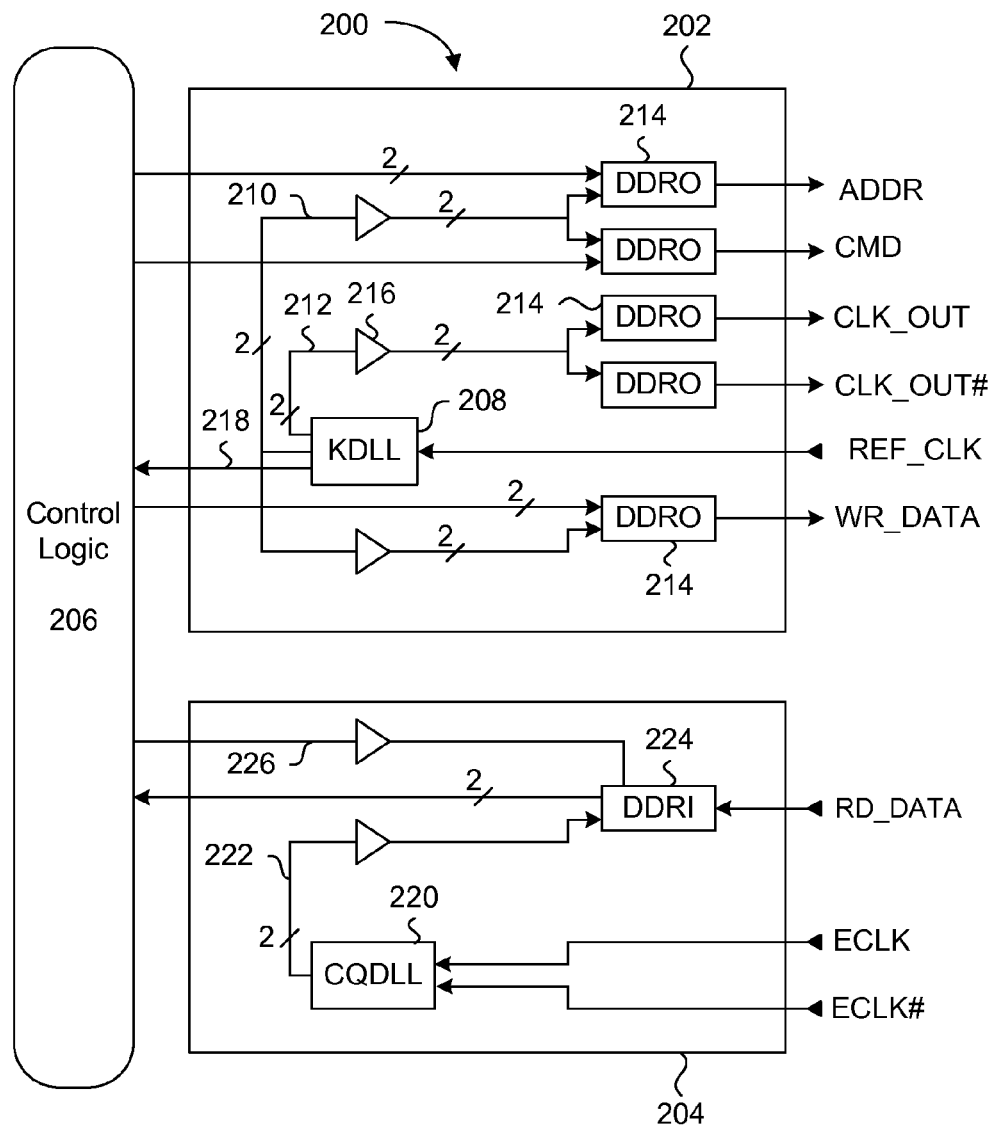
FIG. 2 is a block diagram of a memory interface according to an embodiment of the present invention.

FIG. 2 shows a memory interface according to an embodiment of the present invention. The memory interface shown in FIG. 2 is an example implementation of a QDR SRAM memory interface. Memory interface 200 includes a double data rate converter circuit 202, a single data rate converter circuit 204, and control logic block 206. The control logic block 206 provides system data, such as address, command and write data signals to double data rate converter circuit 202, and receives read data signals from single data rate converter circuit 204. The double data rate converter circuit

202 further receives an input reference clock REF_CLK, which is used to convert the SDR format address, command and write data signals to the DDR format. More specifically, double data rate converter circuit 202 provides memory data, such as address ADDR, command CMD, and write data WR_DATA in the DDR format. A pair of complementary DDR clocks CLK_OUT and CLK_OUT# are provided to the SRAM. The single data rate converter circuit 204 receives input echo clocks ECLK and ECLK# from the SRAM, which are used to convert the DDR memory read data RD_DATA into SDR format. The presently shown example of memory interface 200 is configured for interfacing to one SRAM with one data input channel and data output channel. However, those skilled in the art will understand that this architecture is easily expandable to provide and receive any number of data channels. Furthermore, memory interface 200 can be modified to interface to more than one SRAM device.

Referring to FIG. 2, a further description of the double data rate converter circuit 202 follows. An input reference clock REF_CLK is provided at a frequency equal to the desired operating clock frequency of the interface. The REF_CLK is passed to output DLL KDLL 208, which provides four outputs (clk_0, clk_90, clk_180, clk_270). Each of the four outputs are delayed from each other by ¼ of the input reference clock period (90 degrees). These four outputs are each distributed by equal, balanced clock trees (buffer networks) 210 and 212 to DDRO (double data rate output) circuits 214. All the DDRO circuits 214 are identical to each other, including those without a reference number. It is noted that each clock tree can include at least one clock driver 216. Data, address, or command information to be transmitted to the QDR SRAM is driven from the control logic 206 to the DDRO circuits 214. Each DDRO circuit 214 converts the SDR data stream from the control logic 206 into a DDR data stream in response to a combination of two of the four clock outputs. While not shown in FIG. 2, the outputs of each DDRO circuit 214 can be driven by a dedicated HSTL I/O circuit. A similar path exists for the clock outputs, except that the inputs to the corresponding DDRO circuits 214 receive the other two clock outputs from KDLL 208. The KDLL 208 further provides a copy of its 0 degree output (218) to the control logic 206 for clocking of the control logic.

A further description of the single data rate converter circuit 204 follows with reference to FIG. 2. An echo clock pair ECLK and ECLK#, is provided from the SRAM which is related to the incoming read data. The echo clock pair is sent to an input master-slave DLL CQDLL 220 which independently delays each of these 2 signals by ¼ of the echo clock period (90 degrees). These delayed echo clocks are distributed through equal, balanced clock trees 222 to the DDRI (double data rate input) circuits 224. The DDRI circuits 224 convert single-bit wide DDR data input stream into a two-bit wide SDR data stream for input to the control logic 206. The DDRI circuits 224 can include clock domain crossing logic to transfer the incoming data from the delayed echo clock timing domain to the control logic timing domain. To facilitate this crossing, the control logic clock tree is distributed to the DDRI circuits 224 through bus 226.

As previously mentioned, high-speed interfacing to QDR2 SRAMs results in very small data valid windows. Given the example of an operating frequency of 333 MHz, the clock period is 3 ns and the maximum ideal data valid window is 1.5 ns. Within this ideal 1.5 ns it is required to reliably satisfy the setup (tSU) and hold (tHD) timing requirements of the SRAM inputs. A typical specification is tSU=tHD=0.30 ns. This leaves 0.9 ns for allowances of input clock jitter, host output pin-to-pin skews, SSO/SSI induced timing variations, PCB routing differences, signal differences in IC packaging, crosstalk, and Vref variations. There is no margin in this timing for excessive pin-to-pin variations from the host or excessive PVT (Process, Voltage, Temperature) variations of logic delays within the host. Providing data/commands to the SRAM presents a level of complexities to be resolved, and the read path from the SRAM to the host presents an additional level of complexity as this is the worst-case timing scenario. This is due to the fact that there is a path from the host to the SRAM then back to the host from the SRAM which will have accumulated jitters and skews.

One of the issues solved by the embodiments of the invention is the provision of an output clock which is centered within the output data eye with no PVT reliance, thus providing the maximum amount of tSU and tHD timing margin for the system. Another issue solved by the embodiments of the invention is the provision of data eyes which are as close to ideal (i.e. 1.5 ns at 333 MHz) as possible by avoiding dependencies on the reference clock duty cycle. An additional issue that is mitigated is pin-to-pin timing skews, through the use of DDRO circuit blocks to facilitate the output timing and DDRI circuit blocks to facilitate the input timing. The issues of input echo clock translation for maximum system timing margin without addition PVT uncertainties is addressed in this system through the use of a DLL in the read path. Reliable data capture and timing domain crossing is addressed by the DDRI circuit block.

Referring back to FIG. 2, the output KDLL 208 receives the input reference clock REF_CLK and generates 4 outputs, each separated by 90 degrees. They are named clk_0 (0 degrees), clk_90 (90 degrees), clk_180 (180 degrees) and clk_270 (270 degrees). These output phases are used to enable the provision of a source clock centered in the data eye, to remove the reliance on the input clock duty cycle, and to develop the DDR data stream. Within the DLL, the leading edge of the input reference clock REF_CLK produces the leading edge of the output clocks CLK_OUT and CLK_OUT#. Utilizing only the leading edges within the design removes the duty cycle dependence. According to one embodiment of the present invention, phases 0 and 180 for the output DDR data generation can be used to generate a DDR data stream which is of ideal data width (½ of a clock period) and is not reliant on clock duty cycles. According to another embodiment of the present invention, phases 90 and 270 can be used for the output clock generation. Therefore the logical and physical design of the data path can be mirrored to reduce timing skews, gain the same benefits of output pulse width and non-reliance of input duty cycle as experienced in the data path, and permit a 90 degrees phase shift which will ideally position the clock in the center of the data eye to maximize system timing margins.

The DDRO circuit 214 is a component of the output data path. Developing this component separately in both logic and physical design permits a component which can contain both digital and analog circuits as required to allow full optimization for the application, and results in a block with high reusability. The architecture of memory interface 200 uses one DDRO circuit 214 for each output path of double data rate converter circuit 202. Flexibility is introduced as the interface can be arranged in any desired configuration, and is built simply by instantiating one DDRO component on each output path. The use of these instantiated components which have been physically pre-assembled permits a low pin-to-pin skew for the host since every output path is logically and physically matched, including the clock path.

For the read data path through single data rate converter circuit 204 of FIG. 2, the SRAM outputs echo clock ECLK/

ECLK# and data RD_DATA that are edge-aligned with each other. In other words, the starting transition of the first bit of DDR data output from the SRAM is coincident with the rising edge of the negative echo clock ECLK#, and the starting transition of the second bit of DDR data output from the SRAM is coincident with the rising edge of the positive echo clock ECLK. To properly capture the data and to maximize system timing margins, it is preferable to have a balanced, PVT independent, maximized tSU and tHD allowance at the receiving latch element within the host. It is also preferable to maintain the relationship of specific echo clock to specific data bit to maximize signal matching and thus overall system timing margins.

Again, referring to FIG. 2, the system uses a master-slave DLL CQDLL 220 in the read path. The incoming echo clock pair of ECLK/ECLK# is sent to the CQDLL 220, where one of the clock signals drives a master DLL which outputs a version of the input clock shifted by 90 degrees. The master DLL provides a bias to the slave DLL (also known as 'mirror delay line') to allow the other clock signal to be shifted by 90 degrees. The result is a pair of shifted clocks that are theoretically ideally positioned within the center of the received data eyes. It is noted that this shifted output clock has yet to be distributed to the DDRI circuits 224, whereas the data path to the DDRI circuits 224 themselves is direct. The data path to the DDRI data capture latch and the clock path to the DDRI data capture latch are then designed to create a balanced tSU/tHD system, while also taking into account the tSU and tHD requirements of the DDRI data capture latch. There are techniques known to those skilled in the art for achieving this. For example, a latch element can be designed with a balanced tSU/tHD requirement, with path matching of the clock and data paths to the latch, and/or use of a DLL which supports delay compensation. An optimal method includes incorporating some degree of each of these three methods.

Each DDRI circuit 224 has available to it two clocks, where a rising edge from one clock is coincident with a first bit of the incoming DDR data stream RD_DATA, and a rising edge from the second clock is coincident with the second bit of RD_DATA. Due to the CQDLL 220 and proper path matching techniques, these clocks are centered in their respective incoming data eyes and are used to capture the incoming read data. Once captured, the read data can be treated as a single 2-bit wide data word, thus accomplishing the DDR to SDR conversion. Upon latching the receive data, numerous methods can be applied to cross from the echo clock timing domain back to the control logic timing domain. A FIFO is a common method to perform this crossing. According to an embodiment of the present invention, the DDRI circuit 224 can include this FIFO and the necessary associated circuitry.

The DDRI circuit 224 is a component of the input data path. Developing this component separately in both logic and physical design permits a component which can contain both digital and analog design as required to allow full optimization for the application and results in a block with high reusability. The architecture of memory interface 200 of FIG. 2 uses one DDRI circuit 224 for each input path. Flexibility is introduced as the interface can arranged to have any desired configuration, and is built simply by instantiating one DDRI circuit 224 in each input path. The use of these instantiated components which have been physically pre-assembled permits a low pin-to-pin skew for the host since every input path is logically and physically matched.

Figure 3A:
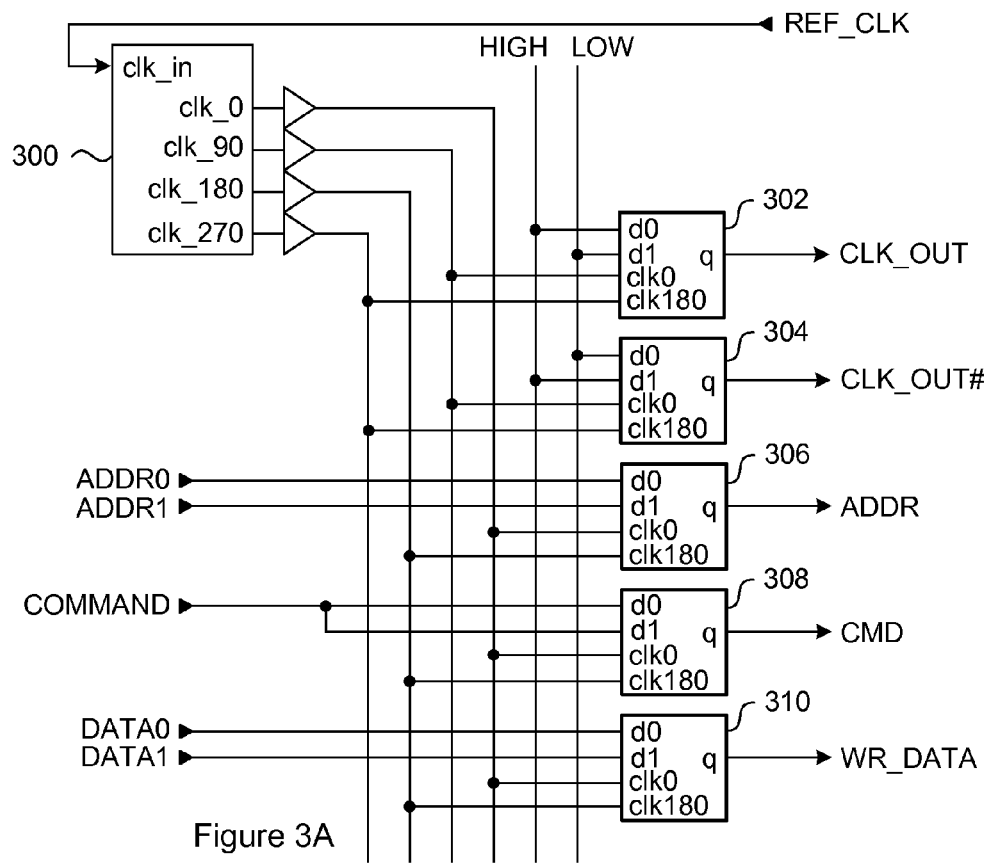
FIG. 3 is a schematic showing connections between the DDRO circuits and the KDLL circuit shown in FIG. 2.
Figure 3B:
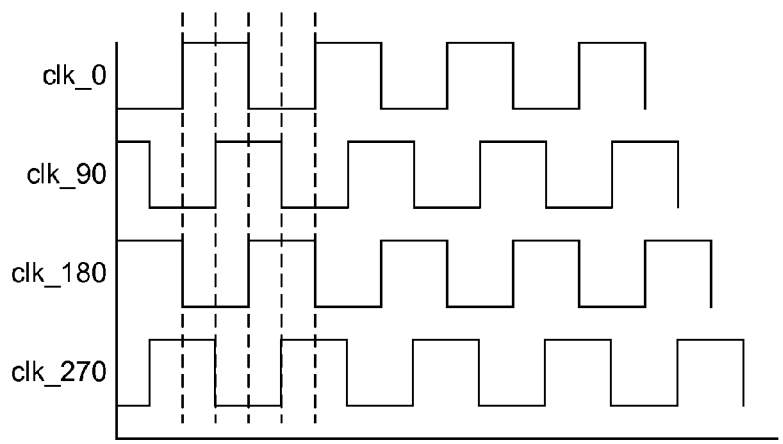

FIG. 3A is a schematic showing further connection details between the DDRO circuits 214 and the KDLL circuit 208 shown in FIG. 2. Referring to FIG. 3, KDLL 300 receives input reference clock REF_CLK, and generates four output clock phases, clk_0, clk_90, clk_180 and clk_270. FIG. 3B graphically shows the phase relationship between the four output clock phases. These four output clock phases are distributed to the five DDRO circuit blocks 302, 304, 306, 308 and 310. More specifically, clk_90 and clk_270 drive DDRO circuit blocks 302 and 304 for the clock outputs CLK_OUT and CLK_OUT#, while clk_0 and clk_180 drive DDRO circuit blocks 306, 308 and 310 for address, command and data signals ADDR, CMD and WR_DATA.

To provide a time-matched system with low pin-to-pin skews, the clock and data paths of these various outputs should be matched. Clock path matching is done by using equal, balanced clock distribution schemes for each of the DLL output phases, even though they have different loading. The use of DDRO circuit blocks 302 to 310 ensures the logic paths are equal. The same DDRO circuit is preferably used on signals of different data types, such as the clock outputs CLK_OUT/CLK_OUT#, the DDR outputs WR_DATA, ADDR and CMD. Beyond the DDRO circuits, the same type of output driver, preferably HSTL (not shown) can be used to ensure highly matched paths.

To convert an SDR data stream from the control logic into a DDR data stream for output, the DDRO circuit 310 receives from the control logic two bits of data in parallel, DATA0 and DATA1. The first data bit DATA0 is output on the clk_0 rising edge, and the second data bit DATA1 is output on the clk_180 rising edge. The DDR address signal ADDR is generated in the same manner, but in response to two address bits ADDR0 and ADDR1 received in parallel. Command signal CMD is generated in the same manner, but in response to one bit of COMMAND. In this embodiment, the d0 and d1 inputs of DDRO circuit 308 both receive the same signal COMMAND. This means that the one bit of COMMAND appears on both the clk_0 and clk_180 rising edges, as the same DDR output circuitry is used. This will improve path matching with the data signals to reduce pin-to-pin skew while retaining a single data rate output for CMD. The clock output CLK_OUT is generated by tying the data inputs d0 and d1 of DDRO circuit 302 to the HIGH and LOW logic states respectively. To generate the complimentary clock output CLK_OUT#, the data inputs d0 and d1 of DDRO circuit 304 are connected in the reverse order, i.e. to the LOW and HIGH logic states respectively. Furthermore, DDRO circuits 302 and 304 receive clk_90 and clk_270.

Figure 4:
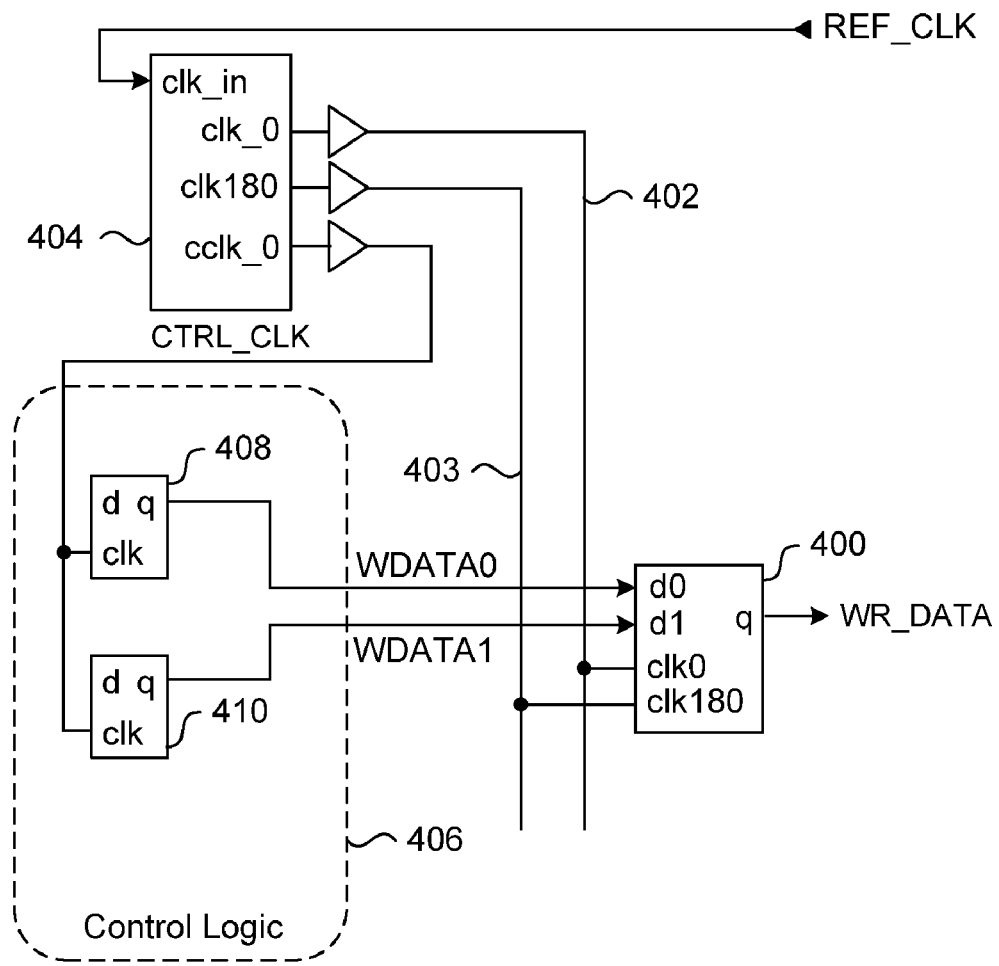
FIG. 4 is a schematic showing control logic for the DDRO circuits of FIG. 2.

FIG. 4 is a schematic showing connection details between control logic 206, the KDLL circuit 208 and one DDRO circuits 214 of FIG. 2. Referring to FIG. 4, the KDLL circuit 404 generates a clk_0 clock, a clk_180 clock and a cclk_0 clock from the input clock REF_CLK. The remaining clocks, clk_90 and clk_270 are not shown in this schematic. To prevent placing an additional constraint on the KDLL circuit 404 that it require a defined propagation delay from its reference clock input to its clk_0 output, the KDLL circuit 404 provides a cclk_0 output from line 408 labeled CTRL_CLK, which is logically identical to clk_0. Hence clock signal cclk_0 is used to drive the clock tree for the control logic 406.

The DDRO circuit 400 receives clk_0 through line 402 and clk_180 through line 403, which is used by DDRO circuit 214 for generating DDR data WR_DATA. Data driven from the control logic 406 to the DDRO circuit 400 should be synchronized. Control logic 406 is shown to include two output DFF flip-flop circuits 408 and 410 for synchronizing data for DDRO circuit 400. Additional components of control logic 406 are not shown in order to simplify the schematic. DFF flip-flops 408 and 410 provide write data WDATA0 and WDATA1 in synchronization with clock cclk_0. It is noted that WDATA0 and WDATA1 are part of the SDR_WR_DATA stream. This ensures that there is a defined relationship between clk_0 of the DDRO circuit 400 and cclk_0 of the control logic 406 for synchronization of data. The DDRO circuit 400 latches both bits of data from the control logic 406 on clk_0 and internally will transfer one of these bits of data with clk_180, which prevents any implications on timing between control logic 406 and DDRO circuit 400.

Figure 5:
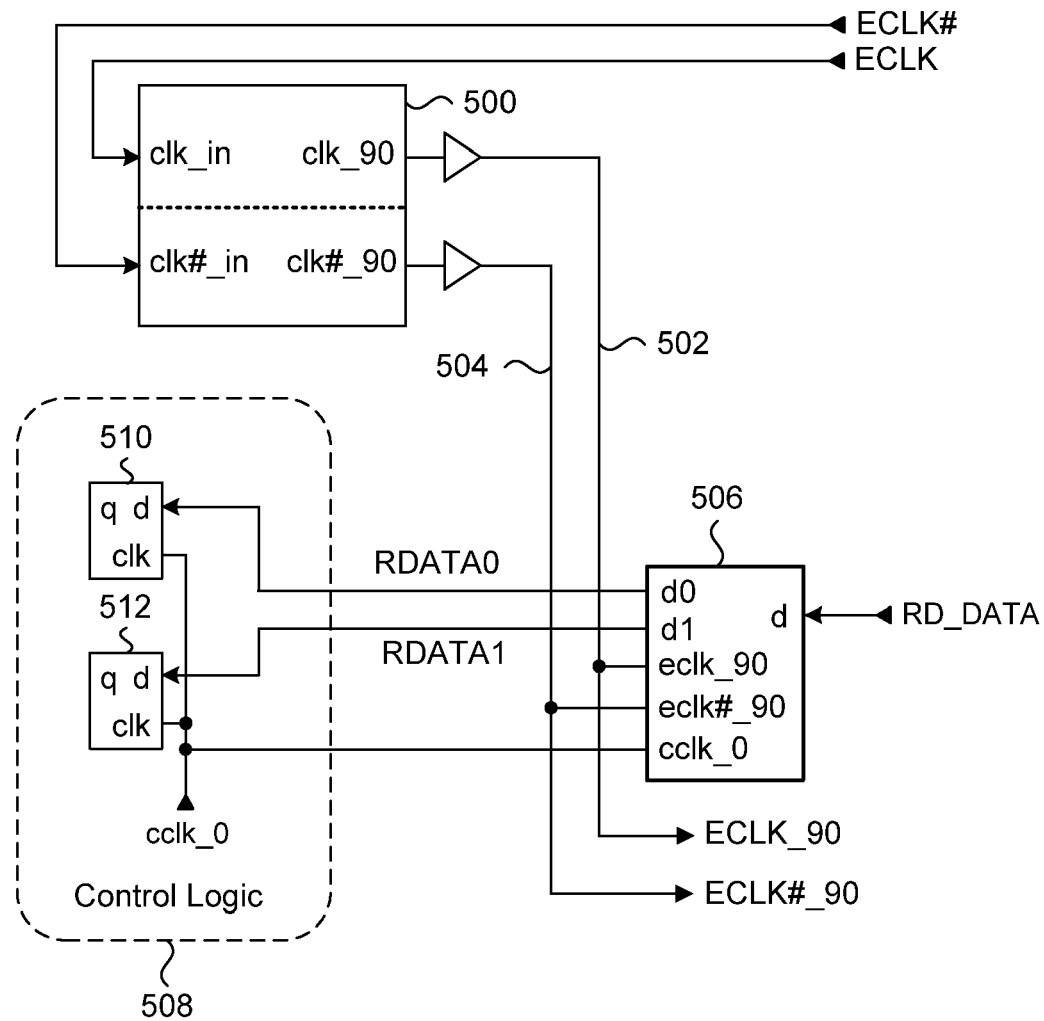
FIG. 5 is a schematic showing connections between the DDRI circuits, the CQDLL circuit and the control logic of FIG. 2.

FIG. 5 shows connection details between the DDRI circuits 224, the CQDLL circuit 220 and the control logic 206 of FIG. 2. Referring to FIG. 5, CQDLL 500 receives echo clock pair ECLK/ECLK# and outputs two clocks ECLK_90 and ECLK#_90 which are replicas of the input clocks shifted by 90 degrees. These shifted clocks are distributed via lines 502 and 504 to the DDRI circuit 506. The DDRI circuit 506 has distributed to it the cclk_0 clock used by the control logic 508 for the integrated synchronizing FIFO. As previously discussed, the synchronizing FIFO and associated logic can be contained within the DDRI circuit 504. DDRI circuit 506 receives DDR read data RD_DATA from the SRAM, and generates a two-bit wide SDR data word consisting of bits RDATA0 and RDATA1. RDATA0 and RDATA1 can be considered part of the SDR_RD_DATA stream. More specifically, RDATA0 can be extracted from the RD_DATA stream on an edge of ECLK, while RDATA1 can be extracted from the RD_DATA stream on a complementary edge of ECLK#. Once extracted, RDATA0 and RDATA1 are clocked out synchronously with cclk_0. Control logic 508 is shown to include two input DFF flip-flop circuits 510 and 512 for receiving RDATA0 and RDATA1 and for passing the data to the system.

To provide a time-matched system with low pin-to-pin skews, it is preferable to match the clock and data paths of these various inputs, and provide an ideal 90 deg phase shift on the clock path. Clock path matching is done by using equal, balanced clock distribution schemes for both of the 90 deg CQDLL 500 outputs. The use of DDRI circuits 506 ensures the logic paths for each data pin are equal. Preferably, identical HSTL input drivers (not shown) can be used for each input, including the echo clock inputs to ensure highly matched paths.

An example of the DDRO circuit is disclosed in U.S. Pat. No. 7,010,713 "Synchronization Circuit and Method with Transparent Latches" granted to Roth et al. on Mar. 7, 2006, the contents of which are hereby incorporated by reference. The patent describes in great detail the time-domain crossing permitted by a pair of transparent latches as the signals are presented to the DDRO circuit. The DDRO circuit embodiments disclosed in that patent application can be used as the DDRO circuits for the presently described embodiments of the high speed QDR SRAM memory interface. It is noted that the transparent latches described in U.S. Pat. No. 7,010,713 are not required in this implementation. The DDRO circuit continues to behave in a similar fashion to that described in the previous application, with the transparent latches removed.

Figure 6A:
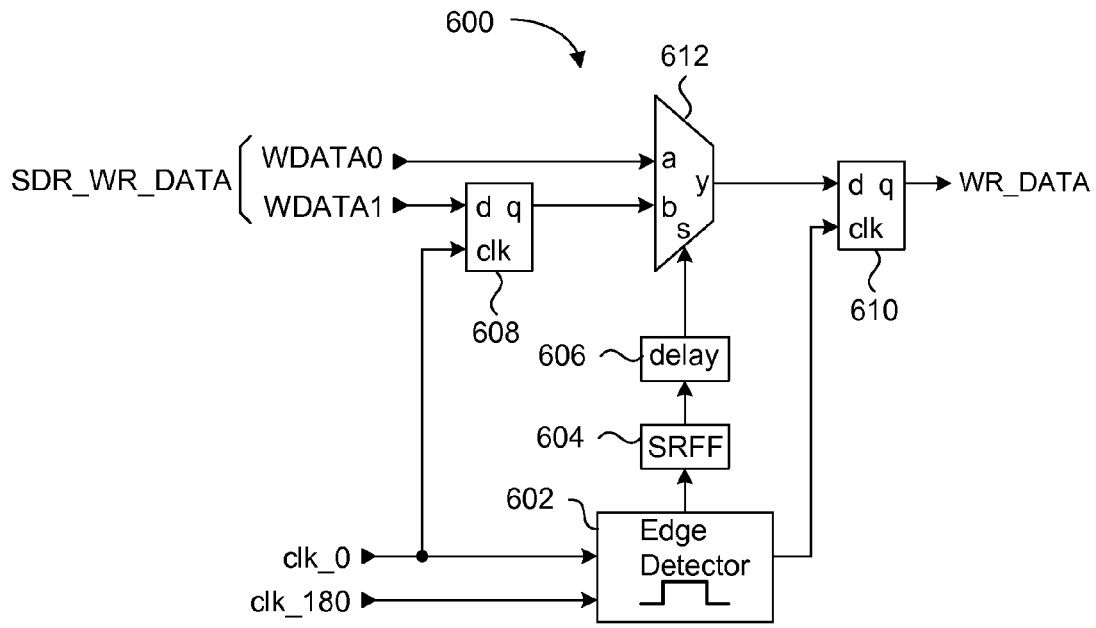
FIG. 6A is a schematic of a DDRO circuit of FIG. 2.

FIG. 6A is a circuit schematic of a DDRO circuit 214 that can be used in the memory interface 200 shown in FIG. 2, according to an embodiment of the present invention. Referring to FIG. 6, the DDRO circuit 600 includes an edge detector 602, a set-reset flip-flop (SRFF) 604, a delay circuit 606, register circuits 608 and 610, and a two-input multiplexor 612. Collectively, edge detector 602, SRFF 604 and delay circuit 606 for edge detection circuitry. Edge detector 602 generates an active signal pulse in response to a rising (or active) edge of either clk_0 or clk_180. This pulse is provided to output register 612, and to SRFF 604. The SRFF 604 controls the multiplexor 612 to pass either DATA0 or the output of holding register 608, which receives DATA1. More specifically, the state of the SRFF 604 changes with each rising edge of the edge detector output signal, meaning that the selection signal received by multiplexor 612 is toggled between the logic "0" and "1" states with each detected edge. The selection signal for switching the multiplexor 612 is delayed by delay circuit 606 to prevent hold timing problems at register circuit 610 if the clock signal propagation to register circuit 610 is slightly slower than the select signal of multiplexor 612. Since the switching of multiplexor 612 and the clocking of register 610 are synchronized, WR_DATA provided at the output of register 610 will be at the DDR format.

Figure 6B:
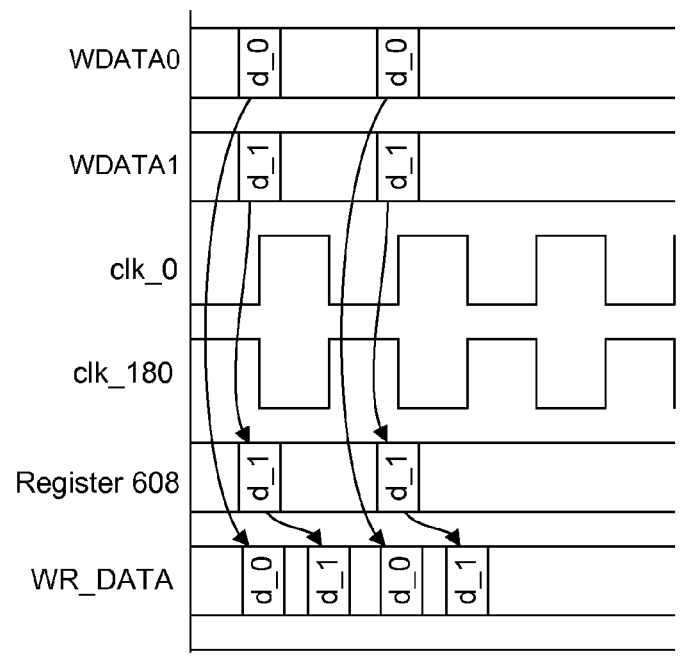
FIG. 6B is a sequence diagram showing the operation of the DDRO circuit of FIG. 6A.

A description of the operation of DDRO circuit 600 now follows with reference to the sequence diagram shown in FIG. 6B. In the initial state, it is assumed that SRFF 604 provides a logic state that sets multiplexor 612 to pass WDATA0 (abbreviated as d_0 in FIG. 6B) as it is received. After the rising edge of clk_0, WDATA0 is received and passed by multiplexor 612 and WDATA1 (abbreviated as d_1 in FIG. 6B) is latched by register 608. Meanwhile, edge detector circuit 602 generates a pulse in response to the rising edge of clk_0, which is provided to output register 610 and SRFF 604. Output register 610 latches WDATA0 in response to the pulse, but the output of SRFF 604 is delayed by delay circuit 606. Therefore, after output register 610 latches WDATA0, multiplexor 612 then switches to pass the output of holding register 608. Thus, the first bit (WDATA0) of the WR_DATA signal is provided. On the rising edge of clk_180, edge detector 602 generates another pulse which is received by output register 610 and SRFF 604. Accordingly, output register 610 latches the output of holding register 608 (WDATA1). Since the output of SRFF 604 is delayed by delay circuit 606, multiplexor 612 then switches back to the initial state. Thus, the second bit (WDATA1) of the DDR WR_DATA signal is provided. As shown in FIG. 6B, two bits of data are provided on the WR_DATA signal in each clk_0 clock cycle.

This DDRO architecture can be used to create a data stream with more than two data bits per clock cycle, i.e. possibly 4 data bits per clock cycle, according to another embodiment of the invention.

Figure 7:
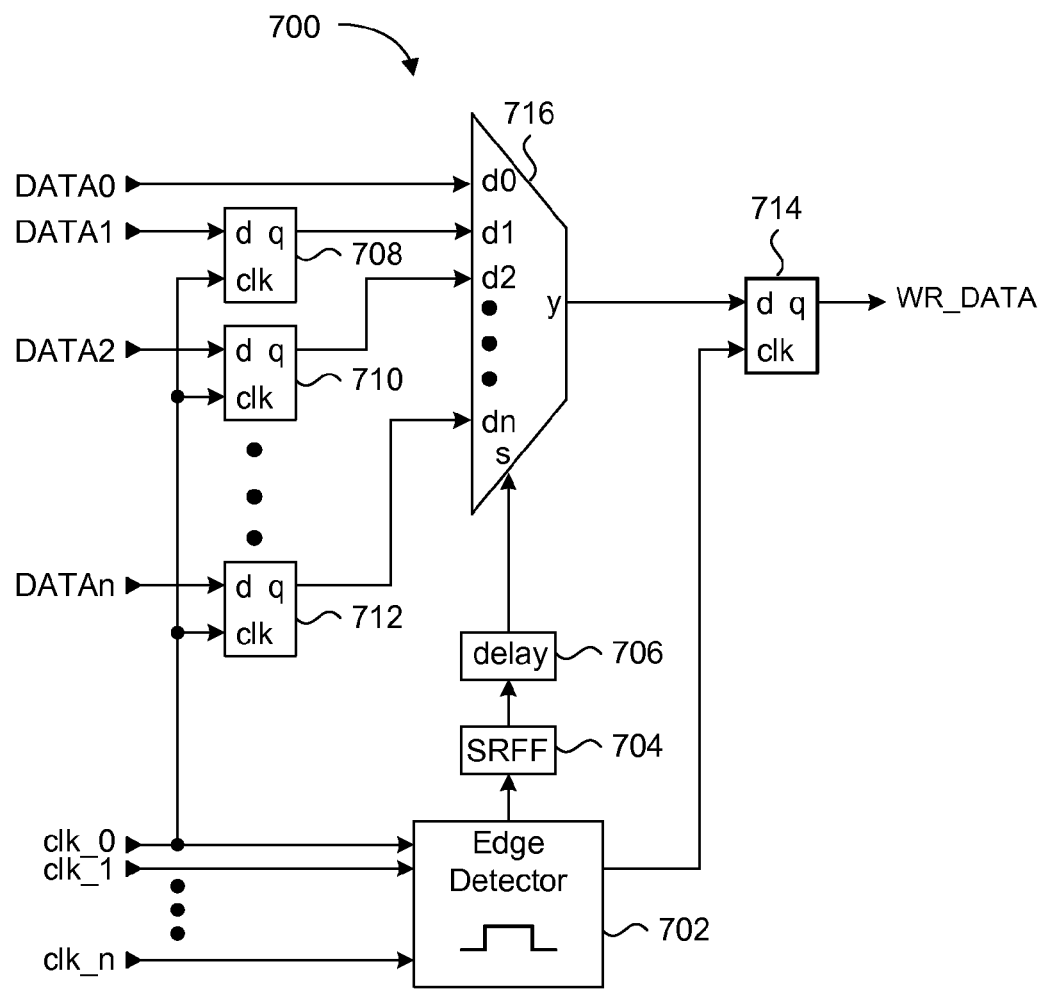
FIG. 7 is a schematic of a DDRO circuit suitable for increased data rates.

FIG. 7 shows a DDRO circuit suitable for increased data rates. Referring to FIG. 7, DDRO circuit 700 includes an edge detector 702, an SRFF 704, a delay circuit 706, input register circuits 708, 710 and 712, an output register 714, and an n-input multiplexor 716. The components shown in FIG. 7 have the same function as those shown in FIG. 6, except that edge detector 702 receives up to n clock signals, labeled clk_0 to clk_n, multiplexor 716 selectively passes any one of the n inputs to the output, and there are now n holding registers. Parameter n is an integer number greater than 0.

The operation of DDRO circuit 700 is substantially the same as for DDRO circuit 600 of FIG. 6, except that instead of receiving two bits of data in parallel, n-bits of data (DATA0 to DATAn) are received in parallel, with a corresponding number of clock phases (clk_0 to clk_n). Those of skill will understand how modifications to the DDRO circuit 600 can be made in order to accommodate the additional data signals and clock phase signals. For example, SRFF 704 can be implemented as a digital counter for counting the pulses from edge detector 702. The multibit output (such as m outputs, where $2^m \leq n$) can then be used to control multiplexor 716.

If it were desirable to utilize a lower number of clock inputs, this could be accomplished by using alternate methods such as the rising and falling edges of clock inputs and thus requiring n/2 clock inputs. Although such a system could be used in theory at various clock frequencies, it is preferably suited to permit higher effective data rates at lower clock frequencies, thus leaving more timing margin for the multiple data bit periods within a single clock period.

Figure 8A:
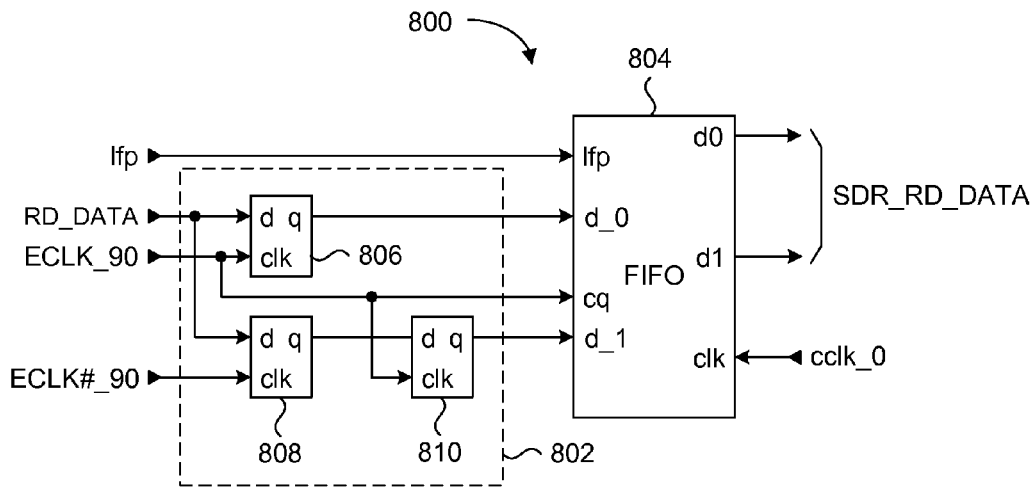
FIG. 8A is a schematic of a DDRI circuit of FIG. 2.

FIG. 8A shows a DDRI circuit 224 that can be used in the memory interface 200 shown in FIG. 2, according to an embodiment of the present invention. The DDRI circuit 800 includes a double to single data rate converter circuit 802 and a clock domain conversion circuit 804. The double to single data rate converter circuit 802 receives a single-bit wide DDR input data stream synchronized to the echo clock (ECLK_90/ECLK#_90) domains, and converts it to a two-bit wide SDR data stream. The clock domain conversion circuit 804 converts the two-bit wide SDR data stream from the ECLK domain to the control logic clock domain cclk_0, and outputs this two-bit SDR data stream synchronized to the cclk_0 clock domain, called SDR_RD_DATA.

The double to single data rate converter circuit 802 includes three word registers 806, 808 and 810 for latching and buffering the DDR input data stream RD_DATA. Word registers 806 and 808 both receive the single-bit wide DDR input data stream RD_DATA, but register 806 is clocked by ECLK_90 while register 808 is clocked by ECLK_90#, which is preferably offset by 180 degrees from ECLK_90. The output of register 806 is provided to the d_0 input of clock domain conversion circuit 804. The output of register 808 is provided to an input of register 810, which is clocked by ECLK_90. The output of register 810 is provided to the d_1 input of clock domain conversion circuit 804. The clock domain conversion circuit 804 can be implemented as a synchronizing first-in-first-out (FIFO) circuit. In addition to receiving the outputs of registers 806 and 810, a lock FIFO pointer signal lfp, and the control logic clock cclk_0 are received.

Figure 8B:
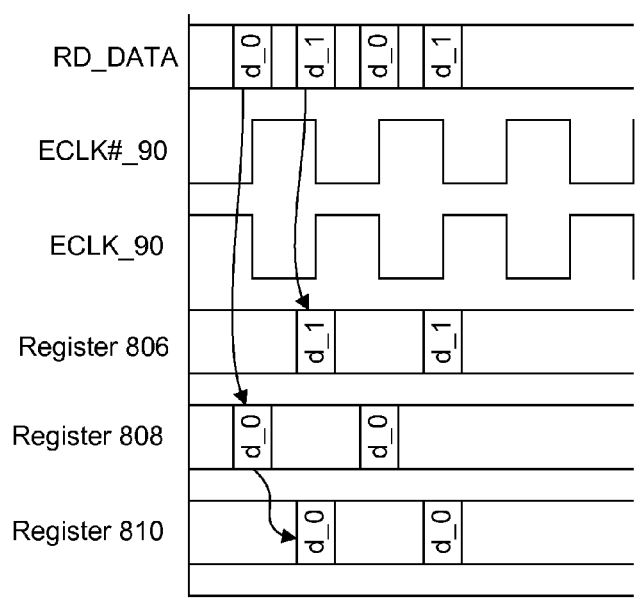
FIG. 8B is a sequence diagram showing the operation of the DDRI circuit of FIG. 8A.

In general operation of double to single data rate converter circuit 802 of FIG. 8A now follows with reference to the sequence diagram of FIG. 8B. The read data RD_DATA is driven from the SRAM in conjunction with a pair of echo clocks, ECLK_90 and ECLK#_90. These two echo clocks are ideally offset by 180 degrees. The RD_DATA data stream consists of two data bits (d_0 and d_1) within the period of one clock cycle, which are driven edge-aligned with the echo clocks. The leading transition of the first data bit d_0 is aligned with the rising edge of ECLK#_90, and the leading transition of the second data bit d_1 is aligned with the rising edge of ECLK_90. The first data bit d_0 of RD_DATA is captured and output by register 808 at the rising edge of ECLK#_90. The second data bit d_1 of RD_DATA is captured and output by register 806 at the rising edge of ECLK_90. At the same time, register 810 captures the first data bit d_0 from register 808 on this same rising clock edge. Accordingly, the single-bit wide DDR data stream has been converted to a two-bit wide SDR data stream synchronous to the ECLK_90 clock domain. Subsequently, the d_0 and d_1 bits of data enter the clock domain conversion circuit 804 for conversion to the cclk_0 domain.

Figure 9:
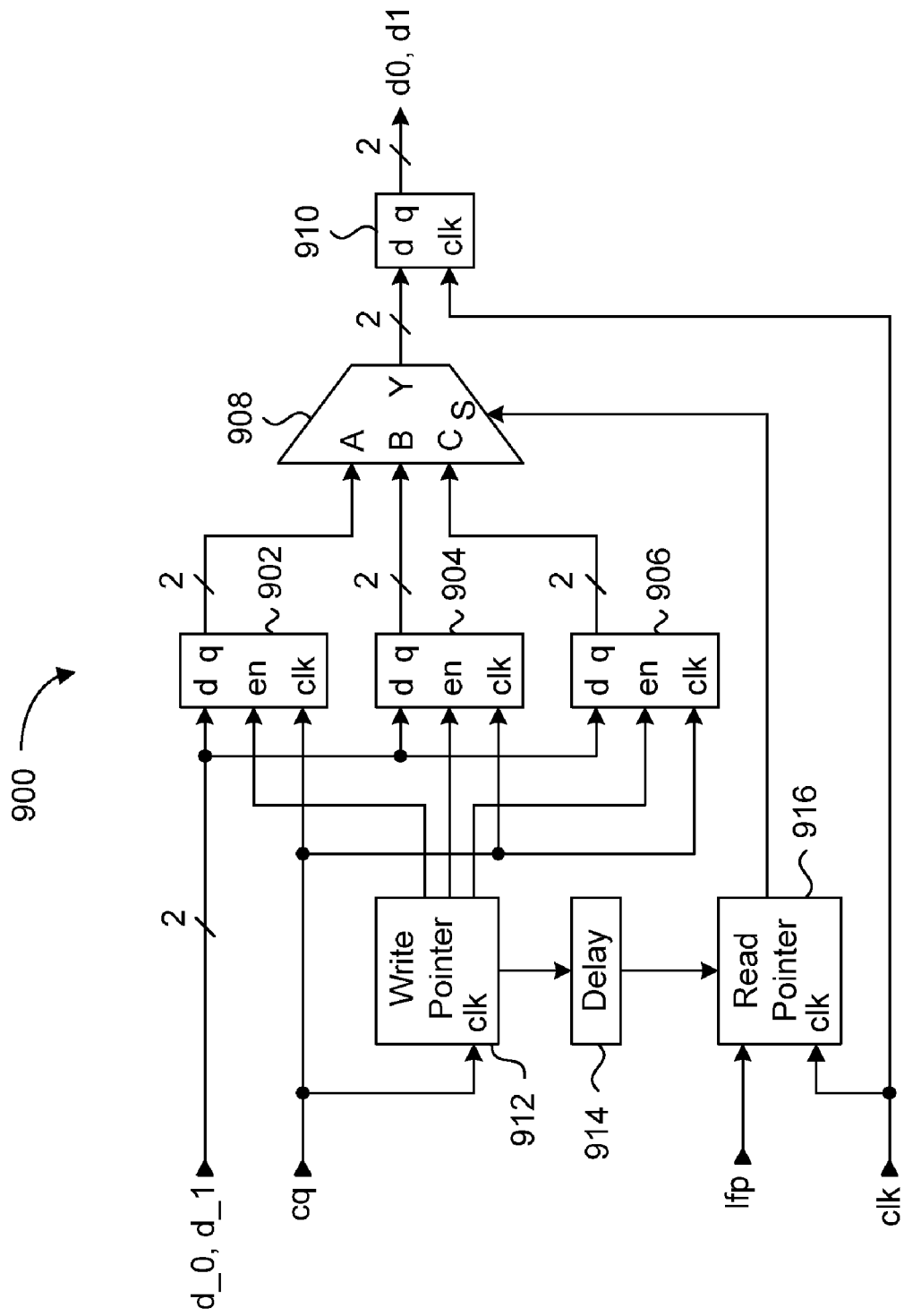
FIG. 9 is a schematic of a DDRI synchronizing FIFO.

FIG. 9 is a schematic of the clock domain conversion circuit 804 shown in FIG. 8A, according to an embodiment of the present invention. It is noted that the input/output port labels of the clock domain conversion circuit 804 are used as the input/output signal names in FIG. 9. As previously discussed, this circuit can be implemented as a FIFO. Clock domain conversion circuit 900 includes two-bit registers 902, 904 and 906, a two-bit multiplexor 908, a two-bit output register 910, a write pointer circuit 912, a delay circuit 914 and a read pointer circuit 916. The two-bit wide components can receive and provide the d_0 and d_1 bits in parallel. The register write clock is cq, which is received by write pointer circuit 912, and the register read clock is clk, which is received by read pointer circuit 916. Two-bit registers 902, 904 and 906 store the two data bits captured from each clock cycle of the input DDR data stream RD_DATA. The echo clocks ECLK_90 and ECLK#_90 from the QDR SRAM are free-running clocks, therefore the DDRI block uses a free-running FIFO that continuously writes and reads data.

In general, each pair of bits d_0 and d_1 extracted from the RD_DATA stream are sequentially clocked into two-bit registers 902, 904 and 906. The outputs of each register is provided to two-bit multiplexor 908. Each two-bit register is enabled by the write pointer circuit 912 synchronously with the cq clock. As the loading of the two-bit registers is occurring, the read pointer circuit selects which register output is to be passed on to two-bit output register 910. Of course, the circuits are configured such that there is no concurrent writing and reading from the same two-bit register, nor is there any overwriting of a two-bit register before it is read.

More specifically, clock domain conversion circuit 900 is designed to prevent timing hazards between clk and cq. The FIFO write pointer circuit 912 preferably uses grey code counting to ensure that only one bit of the write pointer address ever changes at a time. The read pointer is generated from the write pointer at reset/initialization, and then is locked by asserting the lock FIFO pointer lfp input such that the write and read pointers increment independently with a known relationship. The use of grey counting means the data passed to the read pointer logic from the write pointer logic will only ever have one bit changing. Since the cq/clk relationship is unknown, in the worst case the read pointer logic may catch this changing bit as either a 0 or a 1. The method in which the read pointer is generated from the write pointer ensures the read pointer always lags the write pointer by either one or two positions.

The read FIFO is 3 words deep which allows each received word to be valid for three ECLK_90 clock cycles. This is an optimal word depth to allow the read pointer value to be valid regardless of the logic state the changing bit from write pointer to read pointer is resolved to, i.e. whether the read pointer resolves to lag the write pointer by 1 or 2 positions. Since the read pointer always lags the write pointer by either one or two positions, there is never a danger of attempting to read the word that is currently being written and there is also never a danger that the word will be overwritten before it is read. This allows the read pointer to resolve the potentially transitioning bit from the write pointer logic to the read pointer logic to either 0 or 1, as the data will still be valid long enough to be reliably read from the FIFO.

If the cq and clk clocks are approximately aligned with each other, the clock domain conversion circuit 900 can read a FIFO entry which was just written. However, if there is a phase difference between the 2 clocks, then the data will have enough time to be written into the FIFO location before it is subsequently read. To avoid premature reading of a location if the two clocks are approximately aligned, a delay circuit 914 is added between the write pointer circuit 912 and the read pointer circuit 916. This will delay passing of the write pointer data to the read pointer circuit 916, such that it forces the write and read pointers to point to different FIFO locations.

As previously discussed, the write pointer is used to select one of the three FIFO words for writing the two input data bits. It is also used to generate the initial sequence of the read pointer. Since there is not a predictable phase relationship between the write pointer clock (cq) and the read pointer clock (clk), the write pointer is designed to have only one bit changing at any time. This ensures that the read pointer is always correctly generated even when there is slight clock jitter when the initial sequence of the read pointer is being derived from the write pointer.

In the presently shown example of the clock domain conversion circuit 900, a pure gray-code counter will not be used for the write pointer because there are only three FIFO words, and it would not be possible to achieve only a single-bit change. Instead, a 3-bit, 6-state write pointer is used, with two pointer states selecting one FIFO word.

Figure 10:
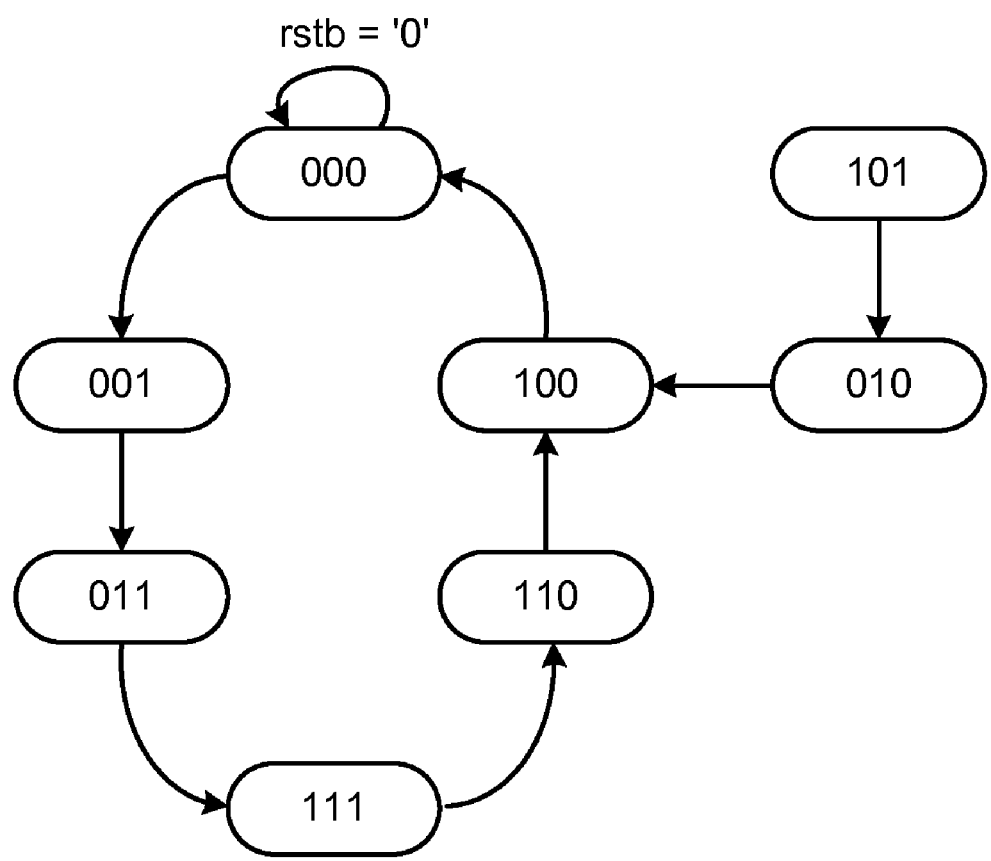
FIG. 10 is an illustration of the DDRI write pointer state transition diagram.

FIG. 10 shows the transitions of a DDRI write pointer state for the write pointer circuit 912 of FIG. 9. Table 1 below shows the write pointer states and corresponding FIFO word write selection. Therefore, as the write pointer increments in value, or position, successive words can be selected. In otherwords, each two-bit register in FIG. 9 can be successively enabled for receiving the d_0 and d_1 pair of bits extracted from the RD_DATA stream. Those skilled in the art will understand that write pointer circuit 912 will include the appropriate decoding logic to enable the proper two-bit register in response to the write pointer address.

TABLE 1

| Write Pointer | Word Selected for Write | State Validity |
|---|---|---|
| 000 | Word 0 | Valid |
| 001 | Word 1 | Valid |
| 011 | Word 2 | Valid |
| 111 | Word 0 | Valid |
| 110 | Word 1 | Valid |
| 100 | Word 2 | Valid |
| 010 | Word 1 and 2 | Invalid |
| 101 | Word 1 and 2 | Invalid |

As shown in FIG. 10 and Table 1, FIFO states '010' and '101' are invalid states and should not occur under normal circumstances. However, the system logic can accidentally enter the invalid states. These states are therefore treated as don't cares. To ensure robustness, the write pointer logic includes the transitioning of the write pointer from the invalid states to valid states. This prevents the write pointer from hanging in an infinite '010'→'101'→'010'→'101' sequence.

Figure 11:
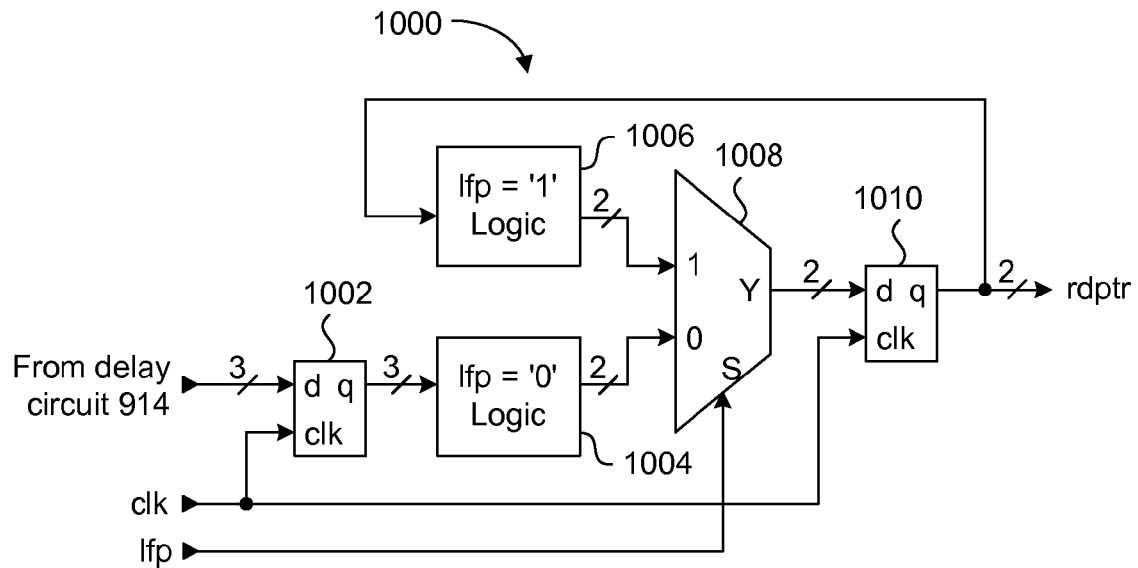
FIG. 11 is a schematic of the FIFO read pointer circuit shown in FIG. 9.

FIG. 11 shows circuit details of the FIFO read pointer circuit 916 shown in FIG. 9. Read pointer circuit 1000 includes an input register 1002, a first pointer logic circuit 1004, a second pointer logic circuit 1006, a multiplexor 1008, and an output register 1010. It is noted that input register 1002 is three bits wide, and first and second pointer logic circuits 1004 and 1006 are both provide two-bit read pointer values. Accordingly, multiplexor 1008 and output register 1010 are both two bits wide. The input register 1002 receives the delayed version of the write pointer from write pointer circuit 912, and provides the latched output to first pointer logic circuit 1004. The output of first pointer logic circuit 1004 is provided to an input of multiplexor 1008, while another input of multiplexor 1008 receives the output of second pointer logic circuit 1006. Multiplexor 1008 selectively passes one of the inputs to its output in response to signal lfp. The output of multiplexor is received and latched by output register 1010, whose output rdptr is fed back to the input of second pointer logic circuit 1006. Both registers 1002 and 1010 are clocked by clk (cclk_0). First pointer logic circuit 1004 maintains a logical relationship between the resulting read pointer value rdptr, and the write pointer value. Second pointer logic circuit 1006 will automatically increment the read pointer value independently of the write pointer value.

Referring to FIG. 11, the initial value of the read pointer is generated from the delayed version of the write pointer. It is noted at this time that write and read pointers preferably have a known and static relationship. Although the relationship will be set at startup, timing drift between the external clock and the internal clock domains can occur. Hence it is possible for this relationship to change. Therefore, signal lfp is used to ensure that the relationship does not change during operation. The read pointer lags the write pointer by position. When the lock fifo pointer (lfp) input is set to '1', the read pointer increments on its own through the feedback loop between output register 1010, second pointer logic circuit 1006 and multiplexor 1008, thus eliminating pointer slippage that may be caused by either jitter on the write pointer clock (cq) or slight differences in the rise and fall times of the write pointer output register 1010. On the other hand, when lfp is set to '0', multiplexor 1008 passes the read pointer value from first pointer logic circuit 1004, which changes in a predetermined manner with the write pointer value.

Data written into a FIFO word remains in that word for 3 clock cycles. The read pointer is designed to select the FIFO data close to the centre of the 3-clock window. The phase between the write clock (cq) and the read clock (clk) determines the phase between the write pointer and the read pointer. If the write pointer is changing near the sampling point of clk, then the previous write pointer value is sampled since the actual signal being sampled is the delayed version of the write pointer. This prevents selecting the data written in the FIFO too early (a little less than a clock cycle). The delay used for sampling the write pointer does not need to be accurate, and neither does it need to be PVT invariant. It should be large enough to give a reasonable margin from the edge of the 3-clock window. A standard buffer delay element is adequate for this purpose.

Figure 12:
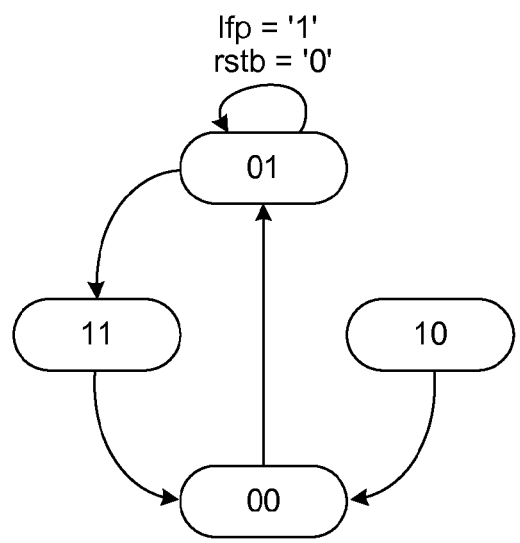
FIG. 12 is an illustration of the DDRI read pointer state transition diagram.

The read pointer uses a basic 2-bit binary count up sequence, except that one state is invalid because there are only 3 FIFO words. State "10" is an invalid state and cannot occur under normal circumstances. This state is therefore treated as don't care. FIG. 12 shows the transitions of the read pointer states and FIFO word read selection. Table 2 shows the predetermined state transitions of the read pointer value with respect to a particular write pointer value when lfp is at the logic '0' state. Table 3 shows the different valued of the read pointer and the corresponding word that is selected for read out by the multiplexor 1008.

The first pointer logic circuit 1004 functionally operates similar to a grey-code decrementer, while the second pointer logic circuit 1006 functionally operates similar to a grey-code incrementer. In the present embodiment, these two circuits can be designed with decoding logic which map input states to defined output states.

TABLE 2

| Delayed Write Pointer | Read Pointer | State Validity |
|---|---|---|
| 000 | 00 | Valid |
| 001 | 01 | Valid |
| 011 | 11 | Valid |
| 111 | 00 | Valid |
| 110 | 01 | Valid |
| 100 | 11 | Valid |
| 010 | 10 | Invalid |
| 101 | 10 | Invalid |

TABLE 3

| Read Pointer | Word Selected for Read | State Validity |
| --- | --- | --- |
| 00 | 00 | Valid |
| 01 | 01 | Valid |
| 11 | 11 | Valid |
| 10 | 00 | Invalid |

There are several advantages of the memory interface design shown in the embodiments of the invention. Mainly, the memory interface can interface to SRAM's at both high and low data rates. The use of a DLL provides a controlled translation of the clock into the center of data eyes on both output and input data paths. Pin to pin skews is minimized because the same data path can be used (i.e. same DDRO) to generate CMD, ADDR, DATA, and CLK outputs to the SRAM. Multiple clock phases from the DLL are used to develop the output data stream versus a 2× clock or using rising and falling edges of the input reference clock, hence there is minimized dependence on the input reference clock duty cycle. The timing-critical circuitry for the data input (read path) can be solidified. The design of the drive and receive logic blocks can be modeled as standard cells to facilitate ASIC place and route flow, and ease of physical implementation.

The presently described embodiments of the memory interface are unique in that DLL's are not typically placed in the drive (output) channel or receive channel due to DLL jitter and its impact to the timing budget. The use of DLL's in this manner typically adds complexity or risk in adding additional analog blocks to the chip, since most prior art solutions rely in the use of fixed and/or adjustable delay lines, instead of an active feedback loop system.

While the previously described embodiments have been illustrated as being applied to QDR2 SRAM, the embodiments can be applied to any memory where high speed operation is desired. Timing values and numerical parameters described herein are exemplary only for clarifying the described embodiments of the invention. Those skilled in the art will understand an interface circuit can be designed to accommodate specific timing values and numerical parameters.

In the embodiment described above, the device elements and circuits are connected to each other as shown in the figures, for the sake of simplicity. In practical applications of the techniques to memory systems, devices, elements, circuits, etc. may be connected or coupled directly to each other. As well, devices, elements, circuits etc. may be connected or coupled indirectly to each other through other devices, elements, circuits, etc., as necessary for operation of the memory systems.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory interface circuit comprising:
a clock phase circuit receiving a reference clock signal and providing a plurality of clock phase signals shifted in phase relative to each other, the clock phase circuit comprising a delay locked loop for providing the plurality of clock phase signals; and
a plurality of output circuits, each output circuit receiving:
one of a plurality of single data rate signals, and
the plurality of clock phase signals,
each of the plurality of output circuits providing:
an output signal having bits from the respective one of the plurality of single data rate signals synchronized to the plurality of clock phase signals, and each of the plurality of output circuits having a substantially identical layout.

2. The memory interface circuit as claimed in claim 1 wherein at least one of the plurality of single data rate signals includes address information.

3. The memory interface circuit as claimed in claim 1 wherein at least one of the plurality of single data rate signals includes data information.

4. The memory interface circuit as claimed in claim 1 wherein at least one of the plurality of single data rate signals includes command information.

5. The memory interface circuit as claimed in claim 1 wherein at least two of the plurality of single data rate signals includes command information, and each of the at least two of the plurality of single data rate signal have a same polarity.

6. The memory interface circuit as claimed in claim 1 wherein the number of the plurality of clock phase signals is two and the clock phase signals are shifted by substantially 180 degrees relative to each other.

7. The memory interface circuit as claimed in claim 1 wherein the number of the plurality of clock phase signals is four and the clock phase signals are shifted by substantially 90 degrees relative to each other.

8. A memory interface circuit comprising:
a clock phase circuit receiving a reference clock signal and providing a plurality of clock phase signals shifted in phase relative to each other, the clock phase circuit comprising a delay locked loop for providing the plurality of clock phase signals; and
a plurality of output circuits,
each output circuit receiving:
a high logic state signal,
a low logic state signal, and
the plurality of clock phase signals,
at least two of the plurality of output circuits providing:
a pair of complementary clock signals, and each of the plurality of output circuits having a substantially identical layout.

9. The memory interface circuit as claimed in claim 8 wherein the number of the plurality of clock phase signals is two and the clock phase signals are shifted by substantially 180 degrees relative to each other.

10. The memory interface circuit as claimed in claim 8 wherein the number of the plurality of clock phase signals is four and the clock phase signals are shifted by substantially 90 degrees relative to each other.

* * * * *

UNITED STATES PATENT AND TRADEMARK OFFICE
CERTIFICATE OF CORRECTION

| | |
|---|---|
| PATENT NO. | : 8,209,562 B2 |
| APPLICATION NO. | : 12/684026 |
| DATED | : June 26, 2012 |
| INVENTOR(S) | : Jody Defazio, Oswald Becca and Peter Nyasulu |

It is certified that error appears in the above-identified patent and that said Letters Patent is hereby corrected as shown below:

Column 14, line 62, "where $2^{\wedge}m \leq n$" should read --where $2^{\wedge}m \geq n$--.

Signed and Sealed this
Nineteenth Day of February, 2013

Teresa Stanek Rea
*Acting Director of the United States Patent and Trademark Office*